(12) United States Patent
Takakuwa et al.

(10) Patent No.: US 6,807,864 B2
(45) Date of Patent: Oct. 26, 2004

(54) PRESSURE SENSOR WITH WATER REPELLENT FILTER

(75) Inventors: Masaki Takakuwa, Toyohashi (JP); Masahito Imai, Chita (JP)

(73) Assignee: Denso Corporation, Kariya (JP)

( * ) Notice: Subject to any disclaimer, the term of this patent is extended or adjusted under 35 U.S.C. 154(b) by 8 days.

(21) Appl. No.: 09/824,708

(22) Filed: Apr. 4, 2001

(65) Prior Publication Data

US 2001/0029786 A1 Oct. 18, 2001

(30) Foreign Application Priority Data

Apr. 17, 2000 (JP) ........................................ 2000-115530
Apr. 17, 2000 (JP) ........................................ 2000-115531

(51) Int. Cl.[7] .................................................. G01L 7/00
(52) U.S. Cl. ............................................ 73/706; 73/700
(58) Field of Search ................................... 73/700–756

(56) References Cited

U.S. PATENT DOCUMENTS

| | | | |
|---|---|---|---|
| 4,051,032 A | * 9/1977 | Borchardt | 210/142 |
| 4,410,443 A | * 10/1983 | Pessimisis | 252/182.33 |
| 5,195,376 A | * 3/1993 | Banks et al. | 73/744 |
| 5,240,593 A | * 8/1993 | Moredock | 210/87 |
| 5,319,980 A | 6/1994 | Kremidas | 73/721 |
| 5,379,650 A | * 1/1995 | Kofoed et al. | 73/861.52 |
| 5,661,244 A | * 8/1997 | Nishimura et al. | 73/706 |
| 5,703,296 A | 12/1997 | Little et al. | 73/756 |
| 5,747,694 A | * 5/1998 | Baba et al. | 73/723 |
| 5,948,989 A | * 9/1999 | Ichikawa et al. | 73/708 |
| 6,046,667 A | * 4/2000 | Mathias | 338/36 |

FOREIGN PATENT DOCUMENTS

| | | |
|---|---|---|
| JP | A-8-184519 | 7/1996 |
| JP | A-8-297064 | 11/1996 |

* cited by examiner

*Primary Examiner*—Edward Lefkowitz
*Assistant Examiner*—Jermaine Jenkins
(74) *Attorney, Agent, or Firm*—Posz & Bethards, PLC

(57) ABSTRACT

A case of a pressure sensor has an atmospheric pressure introduction port for introducing atmospheric pressure into the case, and a water repellent filter that is attached to the atmospheric pressure introduction port to prevent passage of moisture, dust and the like while allowing flow of air. The filter is disposed to have a filter surface extending along a gravitational direction when the pressure sensor is used.

20 Claims, 7 Drawing Sheets

| SENSOR STRUCTURE | OPENING AREA | RESULT |
|---|---|---|
| EMBODIMENT | 48mm² | × |
| | 90mm² | ○ |
| | 150mm² | ○ |
| COM. EXAMPLE | 28mm² | × |

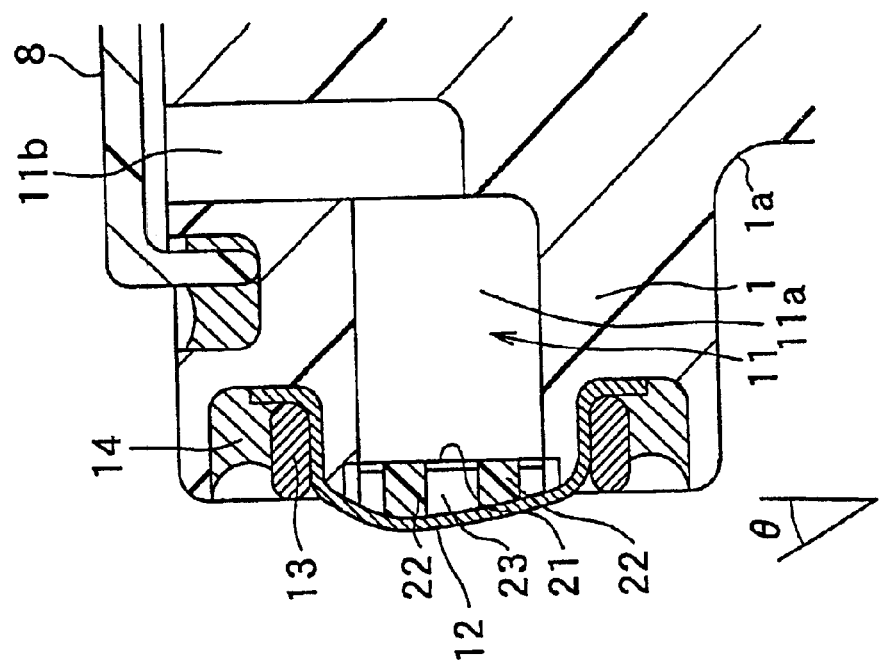
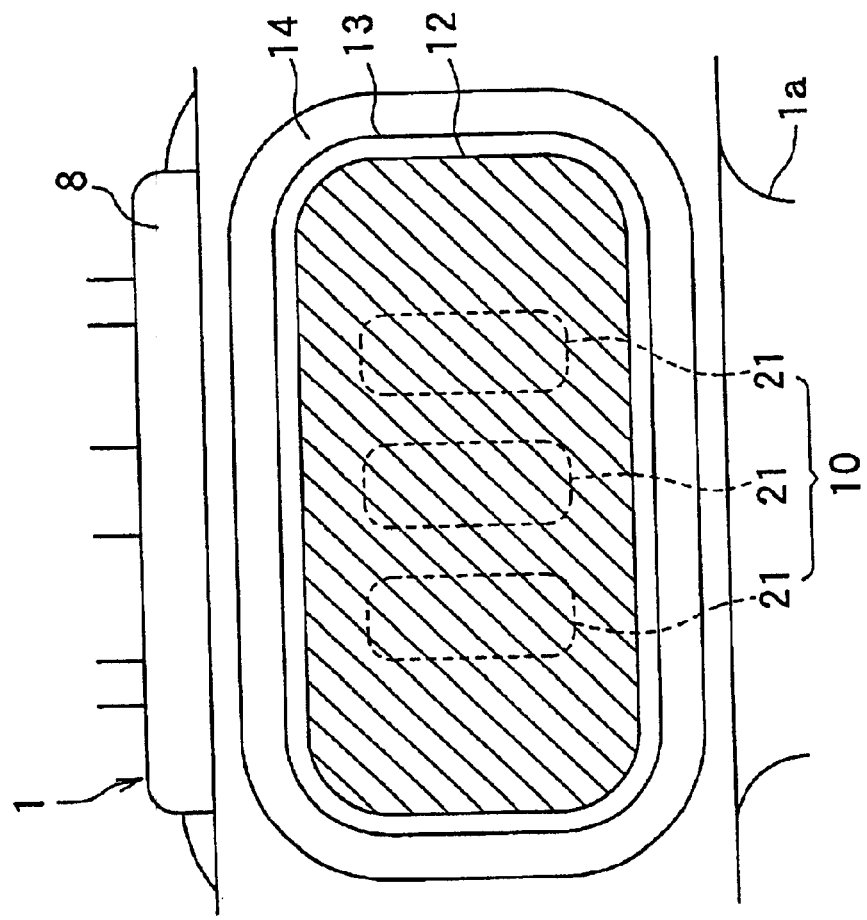
FIG. 7A
FIG. 7B

US 6,807,864 B2

PRESSURE SENSOR WITH WATER REPELLENT FILTER

CROSS REFERENCE TO RELATED APPLICATIONS

This application is based upon and claims the benefit of Japanese Patent Applications No. 2000-115530 filed on Apr. 17, 2000, No. 2000-115531 filed on Apr. 17, 2000, the contents of which are incorporated herein by reference.

BACKGROUND OF THE INVENTION

1. Field of the Invention

This invention relates to a pressure sensor so constructed that environmental pressure outside a case is conducted to a sensor element within the case through a filter, and particularly to a pressure sensor used under harsh environment in which the pressure sensor easily takes water.

2. Description of the Related Art

JP-A-9-43085 and JP-A-9-43076 propose this kind of pressure sensors. In the pressure sensor, a sensor element for detecting pressure is disposed within a case into which environmental pressure (atmospheric pressure) and pressure to be measured (measurement pressure) can be introduced so that the sensor element detects a differential pressure between the two pressures. A water repellent filter is further disposed in a passage through which environmental pressure is introduced, and removes dusts, moisture, and the like in the air.

When the conventional pressure sensor as described above is attached to a measurement member such as a fuel tank of a vehicle, the filter is positioned horizontally with a filter surface facing downward. Because of this, if moisture within pressure medium (air) is attached to the filter, the moisture is difficult to be dropped due to surface tension thereof and may clog the filter. The clogged filter closes the introduction passage of environmental pressure, and prevents the sensor from working. Especially in a case where the sensor easily takes water of rainwater or the like, the above problem becomes prominent.

SUMMARY OF THE INVENTION

The present invention has been made in view of the above problem. An object of the present invention is to prevent clogging of a filter in a pressure sensor so constructed that environmental pressure is introduced into a case through the filter toward a sensor element unit disposed in the case.

According to one aspect of the present invention, briefly, a filter attached to an environmental pressure introduction port, through which environmental pressure is introduced into a case, has a filter surface that is positioned along a gravitational direction when a pressure sensor is used. In the pressure sensor, because the filter surface is positioned along the gravitational direction, moisture attached to the filter surface can easily drop due to the self-weight thereof. Therefore, the filter can be prevented from clogging with moisture. Preferably, the filter surface has a convex shape protruding outwardly from the case. In this case, moisture attached to the filter surface can drop more easily due to reduced surface tension thereof.

According to another aspect of the present invention, an environmental pressure introduction port covered with a filter is divided into a plurality of opening portions. In this case, even little moisture is liable to condense, so that the removal of moisture can be promoted.

BRIEF DESCRIPTION OF THE DRAWINGS

Other features of the present invention will become more readily apparent from a better understanding of the preferred embodiments described below with reference to the following drawings, in which;

FIG. 7A is a plan view showing a main part of the pressure sensor in a direction indicated by arrow VIIA in FIG. 6;

FIG. 7B is an enlarged cross-sectional view showing a part indicated by arrow VIIB in FIG. 6;

DETAILED DESCRIPTION OF THE PREFERRED EMBODIMENTS (First Embodiment)

Figure 1:
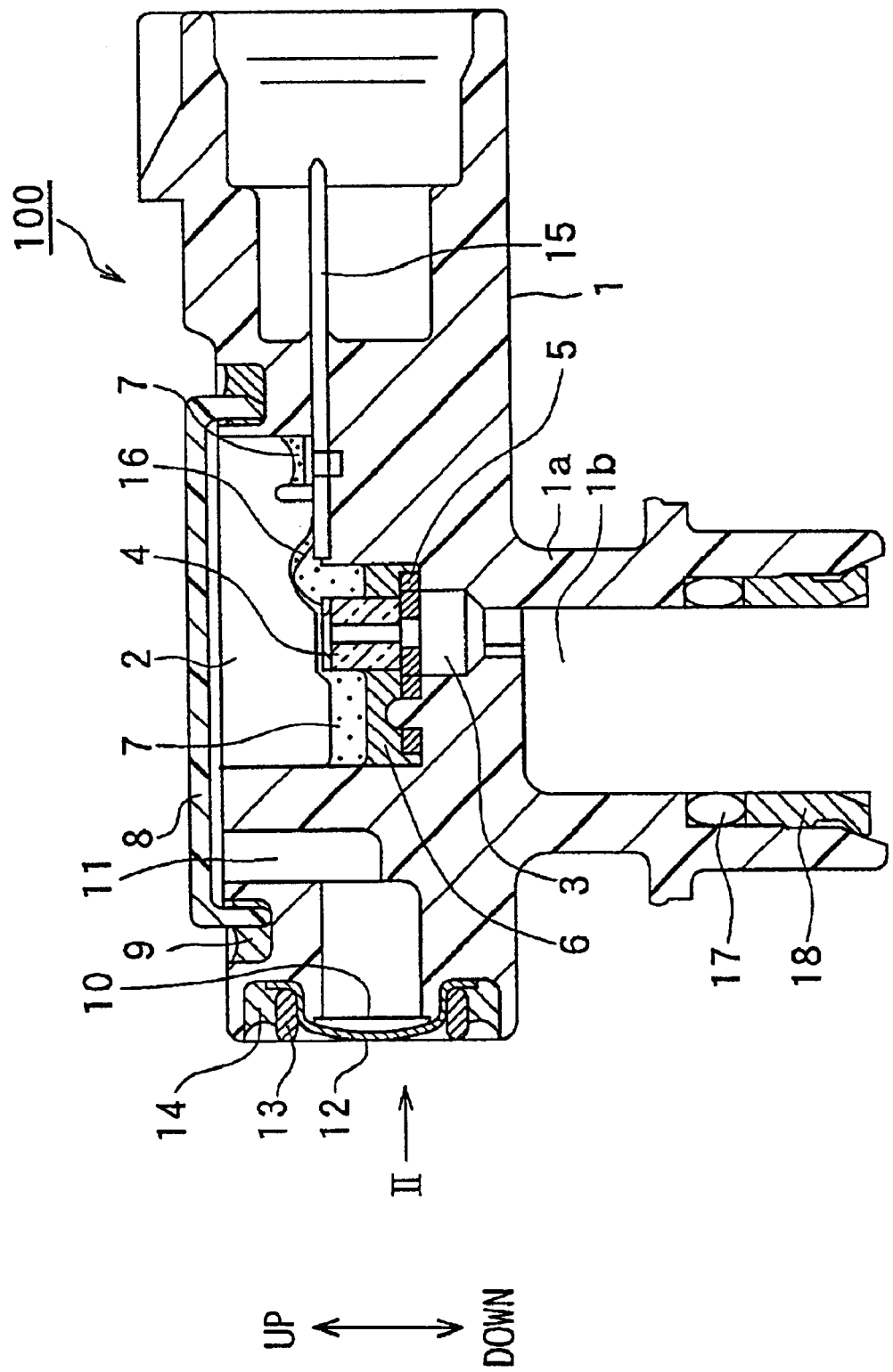
FIG. 1 is a cross-sectional view showing a pressure sensor according to a first embodiment of the present invention.

Referring to FIG. 1, a pressure sensor 100 according to a first embodiment of the invention is so constructed that environmental pressure can be introduced through a filter 12 into a case 1 in which a sensor element unit 4 for detecting pressure is provided. For example, the sensor 100 is attached to a fuel tank (not shown) so that an up-down direction in FIG. 1 corresponds to a vertical direction with respect to the ground (i.e., gravitational direction), and in this case the sensor 100 is used as a fuel pressure sensor for detecting pressure in the tank.

The case 1 is formed by molding resin such as PBT (polybutylene terephthalate) or PPS (polyphenylene sulfide). The case 1 has a recess at the central portion thereof, and the space defined in the recess is divided into a reference pressure chamber 2 into which atmospheric pressure (environmental pressure) is introduced, and a measurement pressure chamber 3 into which measurement pressure such as gasoline vapor is introduced. The sensor element unit 4 is fixed in the recess as a partition between the two chambers 2, 3.

At the opposite side of the case 1 with respect to the recess, a pressure introducing portion 1a is provided as a part of the case 1, and protrudes with a cylindrical shape. A pressure introduction passage 1b for introducing measurement pressure toward the sensor element unit 4 is formed in the pressure introducing portion 1a so that the measurement pressure chamber 3 communicates with the outside of the case 1.

An O-shaped ring 17 made of rubber or the like and a holding member (spacer) 18 for holding the O-shaped ring 17 within the introduction passage 1b are attached to an inner wall of the introduction passage 1b. The pressure introducing portion 1a is connectable to a member such as a hose or a pipe extending from the fuel tank so that it can communicate with the inside of the fuel tank with the O-shaped ring 17 that prevents leakage of pressure transmitted from the member into the conduction passage 1b.

Figure 3:
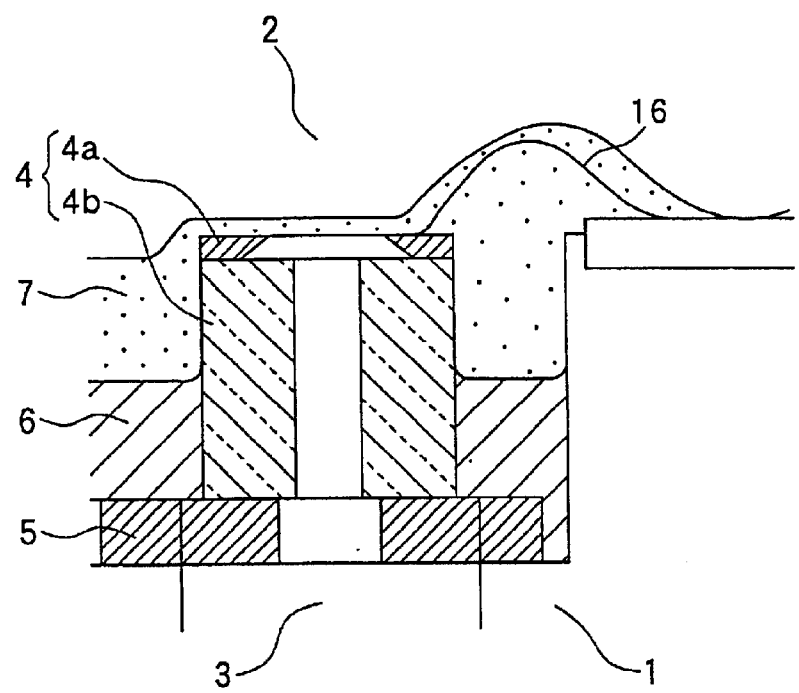
FIG. 3 is en enlarged cross-sectional view showing a sensor element unit in FIG. 1.

The sensor element unit 4 is, as shown in FIG. 3, composed of a pressure sensitive element 4a made of silicon or the like, and a glass base 4b for fixedly holding the pressure sensitive element 4a. The pressure sensitive element 4a is composed of a substrate made of silicon or the like and formed with a diaphragm, and is joined to the glass base 4b whose thermal expansion coefficient is approximate to that of the pressure sensitive element 4a. The glass base 4b has a through hole, and the pressure sensitive element 4a detects a differential pressure between atmospheric pressure introduced from the reference pressure chamber 2 and measurement pressure introduced from the measurement pressure chamber 3.

The sensor element unit 4 is fixed to the case 1 through a hollow-shaped stem 5 having a through hole. The stem 5 adopts 42-alloy (Fe:Ni=58:42) whose thermal expansion coefficient is approximate to that of the glass base 4b. The sensor element unit 4 and the stem 5 are fixed together by adhesive made of thermosetting resin or the like. The stem 5 and the case 1 are also fixed together by adhesive made of thermosetting resin. The measurement pressure conducted from the measurement pressure chamber 3 can be transmitted to the back surface of the pressure sensitive element 4a (surface joined to the glass base 4b) securely by fixing the sensor element unit 4 and the stem 5 to the case 1.

The recess of the case 1 is filled with adhesive 6 such as thermosetting resin and silicone gel 7. The adhesive 6 is to improve air tightness of the fixed portions between the sensor element unit 4 and the stem 5 and between the stem 5 and the case 1. The silicone gel 7 is to improve moisture resistance of the sensor element unit 4. Referring back to FIG. 1, the upper surface of the reference pressure chamber 2 is closed with a lid 8 that is made of resin such as PBT and hermetically fixed by adhesive 9.

Meanwhile, an atmospheric pressure introduction port 10 is provided to externally open at one side of the case 1 to introduce atmospheric pressure (environmental pressure). An atmospheric pressure introduction passage 11 is further formed in the case 1. The atmospheric pressure introduction passage 11 extends from the atmospheric pressure introduction port 10 to the reference pressure chamber 2, and communicates with the reference pressure chamber 2 through a gap provided between the lid 8 and the case 1. Thus, the reference pressure chamber 2 is opened to the air via the atmospheric pressure introduction port 10 and the atmospheric pressure introduction passage 11.

Figure 2:
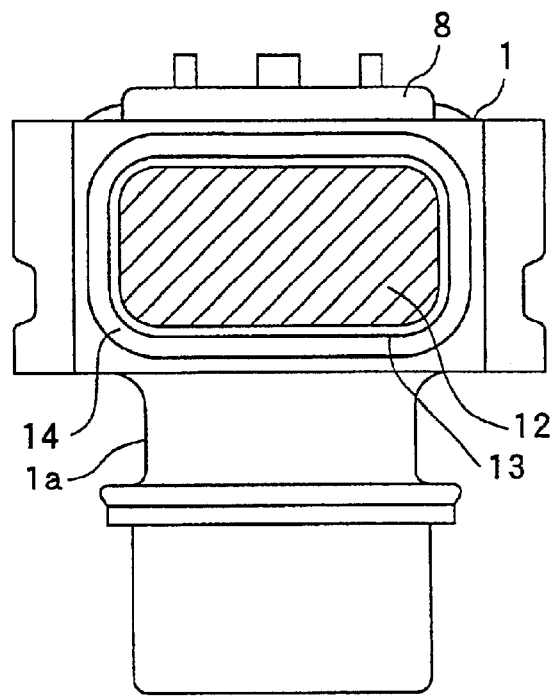
FIG. 2 is a plan view showing the pressure sensor in a direction indicated by arrow II in FIG. 1.

As shown in FIGS. 1 and 2, a water repellent filter (filter portion) 12 composed a sheet made of resin or the like is fixedly attached to the atmospheric pressure introduction port 10. In the present embodiment, when the sensor 100 is used (that is, when the sensor 100 is attached to the measurement member), the filter surface is positioned approximately in parallel with the gravitational direction as shown in FIG. 1.

Figure 4B:
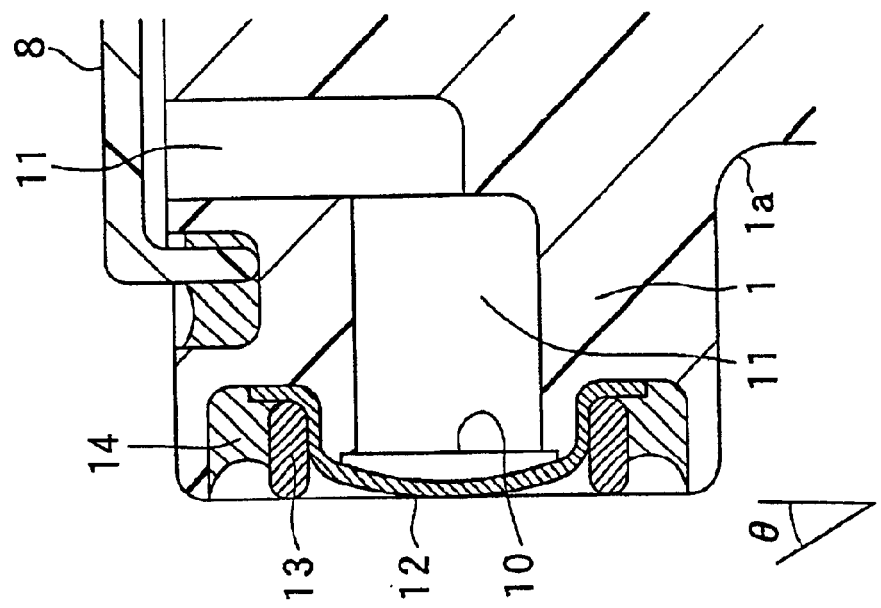
FIGS. 4A and 4B are enlarged views showing a vicinity of an atmospheric pressure introduction port of the pressure sensor in the first embodiment.
Figure 4A:
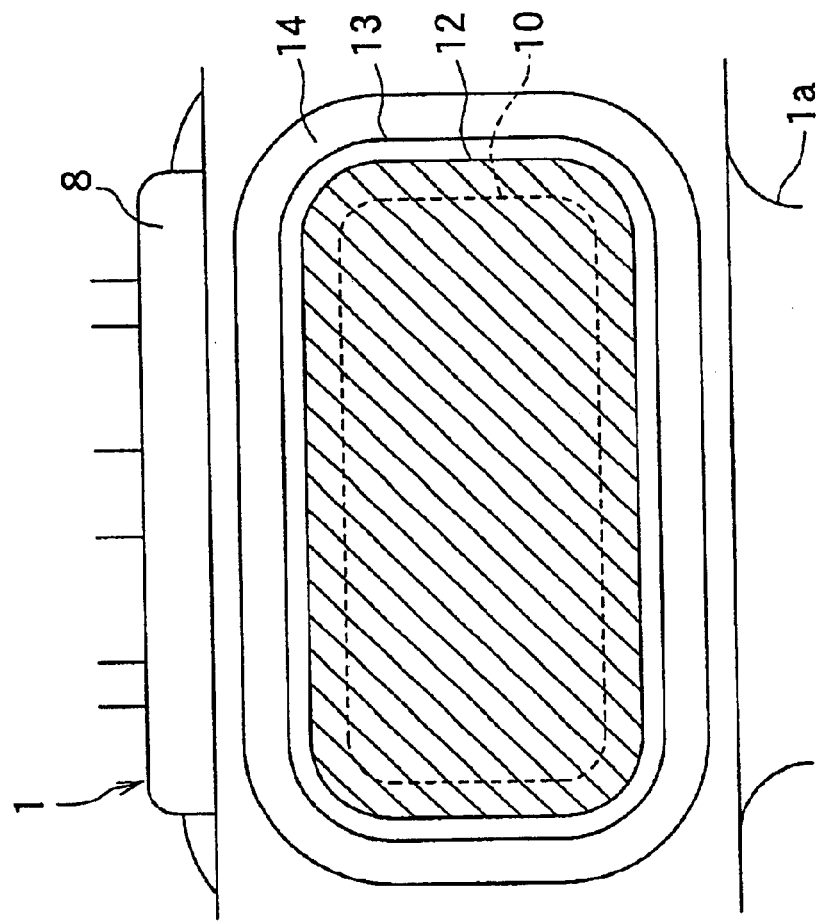

Here, FIGS. 4A and 4B show enlarged views of the vicinity of the atmospheric pressure introduction port 10. FIG. 4A is an enlarged plan view corresponding to FIG. 2, while FIG. 4B is an enlarged cross-sectional view corresponding to FIG. 1. In FIGS. 2 and 4A, the water repellent filter 12 is hatched. In FIG. 4B, although angle θ formed between the filter surface and the gravitational direction is 0°, it is not limited to 0°. A preferable range of angle θ is 0° to 45°.

The water repellent filter 12 is formed from a porous sheet made of fluorine system resin such as polytetrafluoroethylene (PTFE) to which a water repellent treatment has been performed. The water repellent filter 12 is assembled with the case 1 by a filter fixation member (spacer) 13 that is formed into a frame shape (rectangular shape in this embodiment) corresponding to the outer wall shape of the atmospheric pressure introduction port 10. The material constituting the filter fixation member 13 is not limited especially, but is the same as that of the case 1 in the present embodiment.

The assembling of the water repellent filter 12 is performed by, for example, disposing the water repellent filter 12 on the case 1 to cover the atmospheric pressure introduction port 10, press-fitting the fixation member 13 to sandwich the filter 12 with the outer wall of the atmospheric pressure introduction port 10, and adhering the fixation member 13 to the case 1 through adhesive 14 made of epoxy resin to prevent the detachment of the fixation member 13. Accordingly, the water repellent filter 12 and the case 1 are sealed with each other, and dust and moisture are prevented from invading into the reference pressure chamber 2 while allowing a flow of air.

On the other hand, the pressure sensitive element 4a that is fixed to the case 1 through the stem 5 has an output terminal for outputting a detection signal, and the output terminal is connected to a terminal 15 through a bonding wire 16. Accordingly, the signal detected by the pressure sensitive element 4a can be taken out to an outside (for example, an ECU of the vehicle or the like).

Next, a method for manufacturing the pressure sensor 100 is explained briefly. First, the case 1 is molded from resin such as PBT or PPS. At that time, the terminal 15 is insert-molded with the case 1 integrally. The water repellent filter 12 is then fixed to the case 1 in the assembling manner as described above. Next, the O-shaped ring 17 and the holding member 18 are attached to the pressure introducing portion 1a of the case 1.

Successively, the pressure sensitive element 4a is adhered to the glass base 4b to form the sensor element unit 4, and the glass base 4b of the sensor element unit 4 is adhered to the stem 5. Further, the stem 5 is adhered to the recess of the case 1. Accordingly, the inside of the recess is divided into the reference pressure chamber 2 and the measurement pressure chamber 3. Next, the output terminal of the pressure sensitive element 4a is wire-bonded to the terminal 15 with the wire 16.

Then, the adhesive 6 is injected into the side of the reference pressure chamber 2 in the recess, and is hardened by a heat treatment or the like. After that, the silicone gel 17 is injected to cover the sensor element unit 4 and the bonding portion, and is hardened as well. Next, the lid 8 is fixed to the upper end wall of the reference pressure chamber 2 by the adhesive 9, thereby hermetically sealing the reference pressure chamber 2. As a result, the pressure sensor 100 is completed.

The pressure sensor 100 thus manufactured is connected to the measurement member with the O-shaped ring 17 that seals the pressure introducing portion 1a, and becomes usable accordingly. The measurement pressure is conducted into the measurement pressure chamber 3 from the measurement member (fuel tank) through the introduction passage 1b, and is transmitted to the back surface of the pressure sensitive element 4a through the hollow portion of the stem 5 and the through hole of the glass base 4b. The measurement pressure transmitted to the pressure sensitive element 4a is, as described above, detected as a differential pressure with respect to the atmospheric pressure conducted from the reference pressure chamber 2, and is taken out to the outside through the bonding wire 16 and the terminal 15.

According to the present embodiment, the filter surface of the water repellent filter 12 is disposed along the gravitational direction when the sensor 100 is used. Therefore, even when moisture in the environmental pressure medium (air) is attached to the filter surface, the moisture is liable to drop from the filter surface due to the self-weight thereof. Because of this, the water repellent filter 12 hardly clogs with moisture, thereby preventing the introduction passage of the environmental pressure from being closed.

For example, when the pressure sensor 100 is attached to the fuel tank, the sensor 100 easily takes water raised by wheels of the vehicle traveling during rain. Even under such harsh environment, according to the pressure sensor 100 of the present embodiment, because the water repellent filter 12 is prevented from clogging by water attached thereto, the sensor characteristics do not deteriorate.

In addition, an opening area of the atmospheric pressure introduction port 10 has been studied in the present embodiment to enhance the above advantage considering that the larger the opening area of the atmospheric pressure introduction port 10 is, the more effectively the advantage for preventing the clogging as described above may be exhibited. Specifically, as a test, after the entirety of the pressure sensor 100 was immersed into water, the pressure sensor 100 was taken out of water and it was confirmed whether the water repellent filter 12 and the atmospheric pressure introduction port 10 were clogged or not.

Figures 5, 6:
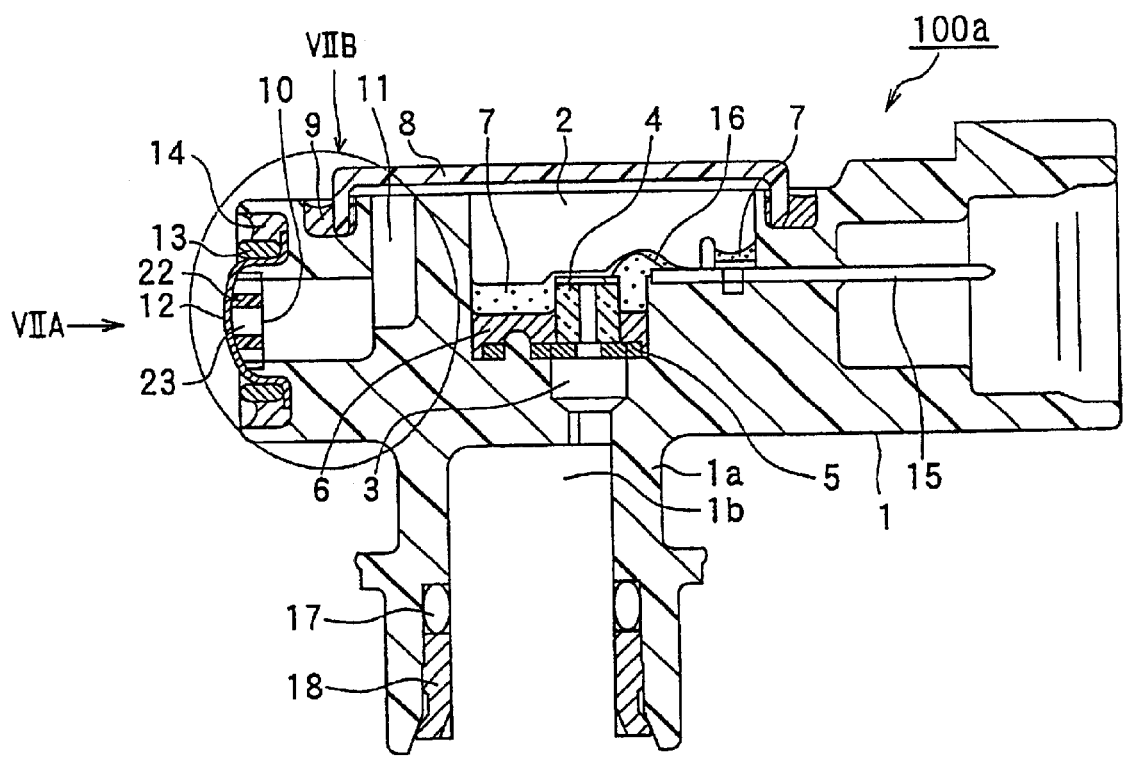
FIG. 5 is a table showing experimental results with respect to an opening area of the atmospheric pressure introduction port.
FIG. 6 is a cross-sectional view showing a pressure sensor according to a second embodiment of the present invention.

Three kinds of pressure sensors 100 according to the present embodiment were formed with various opening areas (48 $mm^2$, 90 $mm^2$, and 150 $mm^2$) of the atmospheric pressure introduction ports 10. Further, as a comparative example, a conventional pressure sensor disclosed in the conventional document described above was formed with an opening area of 28 $mm^2$. In each sensor, several (4 to 6) samples were examined in the test described above. The results are shown in FIG. 5. In the sensors of the comparative example and of the present embodiment with the opening area of 48 $mm^2$, clogging occurred in at least one sample. To the contrary, in the sensors of the present embodiment with the opening areas of 90 $mm^2$ and 150 $mm^2$, all the samples had no clogging. Accordingly, it is revealed that the effect for preventing clogging can be efficiently exhibited when the opening area of the atmospheric pressure introduction port 10 is 90 $mm^2$ or more, even under the environment (where the entirety of the sensor is immersed into water) harsher than the ordinal usage environment.

(Second Embodiment)

In a second embodiment of the present invention, the structures of the water repellent filter 12 and the atmospheric pressure introduction port 10 are modified from those in the first embodiment. In the second embodiment, the same parts as those in the first embodiment are designated with the same reference numerals, and the same explanations are not reiterated.

Figure 8:
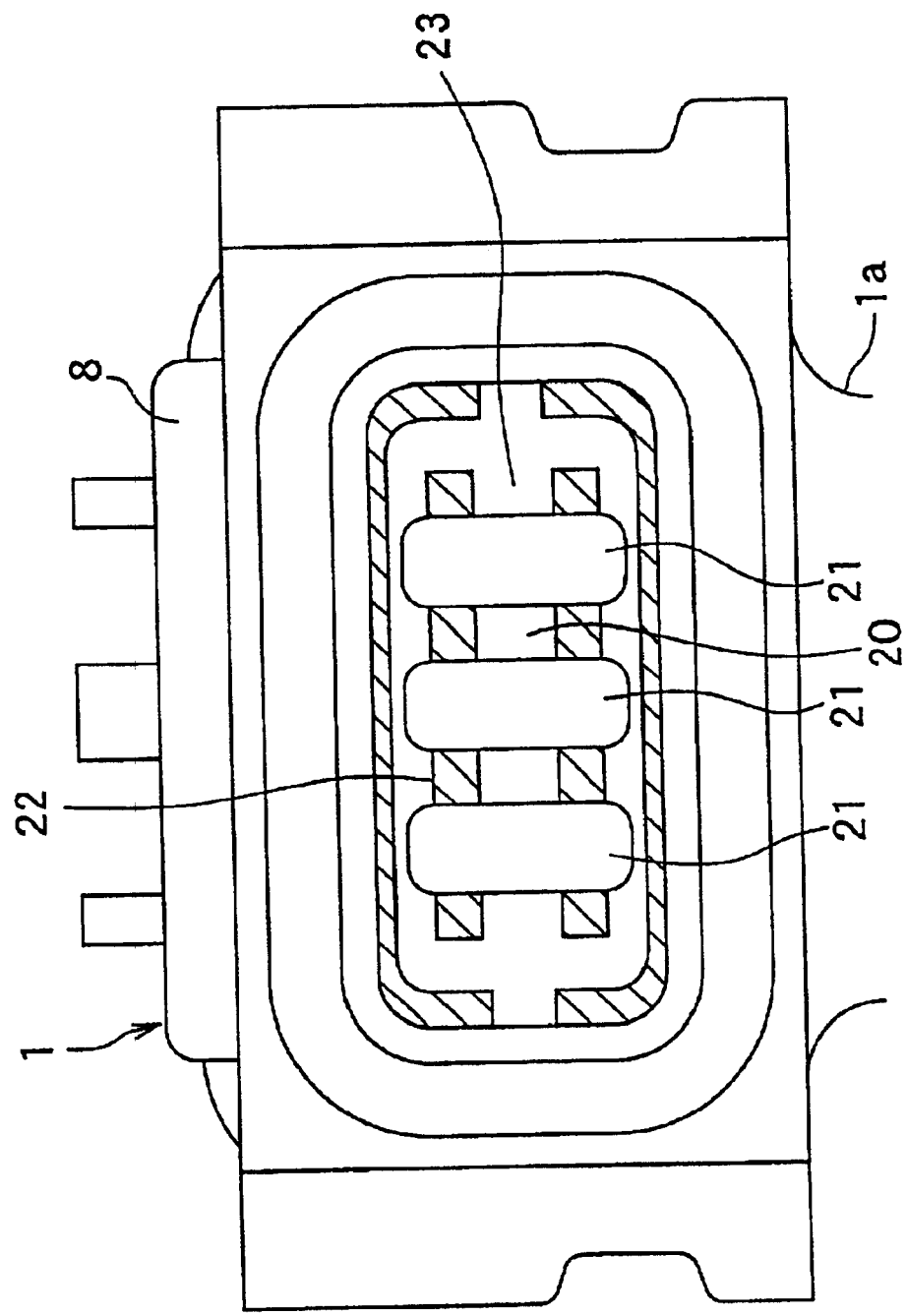
FIG. 8 is a schematic view showing a structure of an atmospheric pressure introduction port of the pressure sensor in the second embodiment.

FIG. 6 shows a pressure sensor 100a in the second embodiment, and FIGS. 7A and 7B show a main part of the pressure sensor 100a. Specifically, FIG. 7A is a plan view corresponding to FIG. 4A and FIG. 7B is a cross-sectional view corresponding to FIG. 4B. FIG. 8 shows a detailed structure of the atmospheric pressure introduction port 10 from which the water repellent filter 12 and the filter fixation member 13 are detached.

In the first embodiment described above, the atmospheric pressure introduction port 10 is composed of a single opening portion. As opposed to this, in the present embodiment, as shown in FIG. 7A, the atmospheric pressure introduction port 10 is composed of several (three in the figure) opening portions 21 divided by a frame 20. Each of the opening portions 21 has an elongated shape elongated in the gravitational direction. In this embodiment, each of the opening portions 21 has a rectangular shape with a long side parallel to the gravitational direction.

Here, in the atmospheric pressure introduction passage 11, a passage part extending from the atmospheric pressure introduction port 10 to the side of the reference pressure chamber 2 (in the lateral direction in FIG. 7B) is referred to as a first passage 11a, and a passage part extending from the first passage 11a to the side of the lid 8 (in the vertical direction in FIG. 7B) is referred to as a second passage 11b. In the present embodiment, several first passages 11a are provided in parallel to correspond to the several opening portions 21, and a single second passage 11b is provided to join and communicate with the several first passages 11a.

Also, although the filter surface of the water repellent filter 12 is approximately flat (slightly convex) in the first embodiment, as shown in FIG. 7B, the filter surface has a convex shape protruding outward (more largely) from the case 1 in the second embodiment. Specifically, as shown in FIGS. 7B and 8, the frame 20 for dividing the opening portions 21 is formed with protrusions 22 protruding to the outside of the case 1, and the filter surface of the water repellent filter 12 is disposed in contact with the distal ends of the protrusions 22. Accordingly, the filter surface can form the convex shape in accordance with the protruding heights of the protrusions 22.

As shown in FIG. 8 with hatching (that is not a cross-section), the protrusions 22 are not provided at a part of peripheral edge portions of the opening portions 21, and gap portions 23 are provided between the frame 20 and the filter surface where the protrusions 22 are not provided. Therefore, the atmospheric pressure can be introduced into the opening portions 21 through the filter surface of the water repellent filter 12 and the gap portions 23.

According to the second embodiment, like the first embodiment, the filter hardly clogs with water and the like, and the environmental pressure introduction passage can also be prevented from clogging. In addition, the following advantages can be provided.

Figure 9:
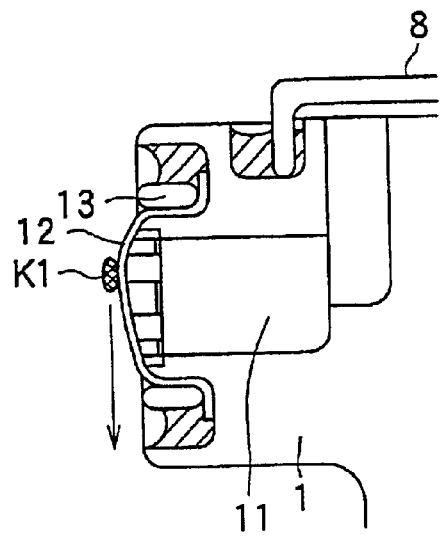
FIG. 9 is an explanatory view showing an effect due to a convex filter surface of a filter in the second embodiment.

First, because the filter surface of the water repellent filter 12 is formed with a convex (curved) shape such as an R-like shape or a spherical shape protruding outwardly from the case 1, the surface tension of water can be reduced as compared to the case where the filter surface is flat. Because of this, for example, as shown in FIG. 9, even when moisture or foreign matter K1 such as dust is attached to the filter surface of the water repellent filter 12, it can be dropped more easily in comparison with the case where the filter surface is flat.

When the protrusions 22 include upper and lower protrusions arranged in the gravitational direction as shown in FIG. 7B, the upper protrusion preferably has a protruding height larger than that of the lower protrusion to enhance the above advantages. Here, in the first embodiment described above, the water repellent filter 12 may be assembled with the case 1 to have a convex filter surface protruding to the outside of the case more largely. In this case, the same advantages as those of the first embodiment can be provided.

Also, according to the second embodiment, because the atmospheric pressure introduction port 10 is composed of several opening portions 21 divided by the frame 20, a contact area of air flowing in the port 10 and moisture is increased due to the frame 20 in comparison with the case where the atmospheric pressure introduction port 10 is composed of a single opening portion, so that even a little moisture can be promoted to condense. As a result, moisture is collected by the water repellent filter 12 and is prevented from invading inside the filter 12. In consequence, the water removing performance of the filter 12 can be enhanced. That is, moisture condenses and drops from the filter 12 more easily, so that moisture can be removed more efficiently.

Further, according to the second embodiment, because the gap portions 23 capable of introducing atmospheric pressure (environmental pressure) are provided between the frame 20 and the filter surface of the water repellent filter 12, the gap portions 23 can securely conduct the atmospheric pressure toward the sensor element unit 4 even if the filter surface clogs.

Figure 10:
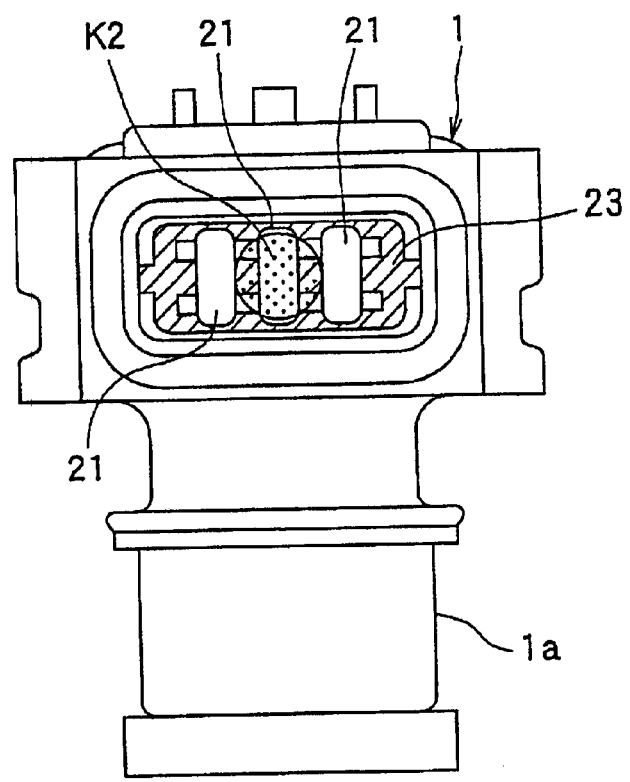
FIG. 10 is an explanatory view showing an effect of gap portions of the filter in the second embodiment.

For example, as shown in FIG. 10, even if foreign matter K2 such as dirt is attached to the filter surface of the water repellent filter 12 to close one of the opening portions 21, the communication between the outside and the opening portion 21 can be attained because the gap portions 23 are provided as hatched in FIG. 10. Therefore, the atmospheric pressure introduction passage can be securely prevented from being closed as long as the entire region of the filter surface is clogged with foreign matters.

In the above-described embodiments, the present invention is applied to a relative pressure sensor for detecting a differential pressure between atmospheric pressure and measurement pressure; however, the present invention is not limited to that, but may be applied to various sensors such as a pressure sensor that detects a pressure based on atmospheric pressure (environmental pressure) as absolute pressure introduced toward a sensor element unit. That is, the feature of the present invention is, in a pressure sensor for introducing through a filter environmental pressure from an outside of a case toward a sensor element unit disposed within the case, the filter surface of the filter attached to an induction port of the case is disposed approximately along the gravitational direction, and the other features may be changed appropriately.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A pressure sensor comprising:
a case having an environmental pressure introduction port;
a sensor element unit disposed in the case for detecting a pressure based on an environmental pressure introduced into the case through the environmental pressure introduction port; and
a filter attached to the environmental pressure introduction port so that the environmental pressure enters the case after passing through the filter, the filter having a filter surface that is positioned along a gravitational direction when the pressure sensor is used.

2. The pressure sensor according to claim 1, wherein the filter comprises a water repellant filter.

3. A pressure sensor comprising:
a case having an environmental pressure introduction port;
a sensor element unit disposed in the case for detecting a pressure based on an environmental pressure introduced into the case through the environmental pressure introduction port; and
a filter attached to the environmental pressure introduction port so that the environmental pressure enters the case after passing through the filter, the filter having a filter surface that is positioned along a gravitational direction when the pressure sensor is used,
wherein the filter surface of the filter has a convex shape protruding to an outside of the case.

4. The pressure sensor according to claim 3, wherein the filter comprises a water repellant filter.

5. A pressure sensor comprising:
a case having an environmental pressure introduction port;
a sensor element unit disposed in the case for detecting a pressure based on an environmental pressure introduced into the case through the environmental pressure introduction port; and
a filter attached to the environmental pressure introduction port so that the environmental pressure enters the case after passing through the filter, the filter having a filter surface that is positioned along a gravitational direction when the pressure sensor is used,
wherein the environmental pressure introduction port is composed of a plurality of opening portions that are divided by a frame.

6. The pressure sensor according to claim 5, wherein each of the plurality of opening portions has an elongated shape with a longitudinal direction approximately parallel to the gravitational direction.

7. The pressure sensor according to claim 5, wherein:
the frame has a protrusion protruding outward from the case; and
the filter is disposed in contact with a distal end of the protrusion to have the filter surface that is convex and to define a gap portion between the frame and the filter for conducting the environmental pressure into the case.

8. The pressure sensor according to claim 5, wherein the filter comprises a water repellent filter.

9. A pressure sensor comprising:
a case having an environmental pressure introduction port;
a sensor element unit disposed in the case for detecting a pressure based on an environmental pressure introduced into the case through the environmental pressure introduction port; and
a filter attached to the environmental pressure introduction port so that the environmental pressure enters the case after passing through the filter, the filter having a filter surface that is positioned along a gravitational direction when the pressure sensor is used,
wherein the environmental pressure introduction port has an opening area equal to or larger than 90 mm$^2$.

10. The pressure sensor according to claim 9, wherein the filter comprises a water repellant filter.

11. A pressure sensor comprising:
a case having an environmental pressure introduction port;
a sensor element unit disposed in the case for detecting a pressure based on an environmental pressure introduced into the case through the environmental pressure introduction port; and a filter attached to the environmental pressure introduction portion so that the environmental pressure is introduced into the case after passing through the filter, wherein:

the environmental pressure introduction port is divided into a plurality of opening portions that are covered with the filter.

12. The pressure sensor according to claim 11, further comprising a frame dividing the environmental pressure introduction port into the plurality of opening portions.

13. The pressure sensor according to claim 12, wherein:

the frame has a protrusion protruding outwardly from the case; and the filter is disposed in contact with a distal end of the protrusion to provide a gap portion between the filter and the frame for introducing the environmental pressure into the case.

14. The pressure sensor according to claim 13, wherein:

the environmental pressure introduction port is open in an approximately horizontal direction; and the filter disposed in contact with the distal end of the protrusion has a filter surface that is curved and extends approximately in parallel with a vertical direction.

15. The pressure sensor according to claim 13, wherein:

the frame has first and second protrusions protruding outwardly from the case and arranged in a gravitational direction;

the first protrusion arranged at an upper side of the second protrusion has a protruding height larger than that of the second protrusion; and the filter is disposed in contact with both first and second distal ends of the first and second protrusions to have a curved filter surface.

16. The pressure sensor according to claim 11, wherein the filter comprises a water repellant filter.

17. A pressure sensor comprising:

a case having a measurement pressure introduction passage extending in a vertical direction for introducing a measurement pressure and an environmental pressure introduction passage extending in a horizontal direction and having an environmental pressure introduction port that is open in the horizontal direction for introducing an environmental pressure;

a sensor element disposed in the case for detecting the measurement pressure based on the environmental pressure; and a filter covering the environmental pressure introduction port.

18. The pressure sensor according to claim 17, wherein the filter has a filter surface extending in a direction that forms a specific angle with the vertical direction, the specific angle falling in a range of 0 to 45°.

19. The pressure sensor according to claim 17, wherein the filter has a convex filter surface protruding outward from the case in the horizontal direction.

20. The pressure sensor according to claim 17, wherein the filter comprises a water repellant filter.

* * * * *